(12) United States Patent
Oka et al.

(10) Patent No.: US 8,866,027 B2
(45) Date of Patent: Oct. 21, 2014

(54) PRINTED WIRING BOARD AND METHOD FOR MANUFACTURING THE SAME

(75) Inventors: Yoshio Oka, Osaka (JP); Jinjoo Park, Osaka (JP); Kazuyuki Maeda, Osaka (JP); Narito Yagi, Osaka (JP); Tetsuya Shimomura, Kouga (JP); Junichiro Nishikawa, Kouga (JP)

(73) Assignees: Sumitomo Electric Industries, Ltd., Osaka (JP); Sumitomo Electric Printed Circuits, Inc., Shiga (JP)

( * ) Notice: Subject to any disclaimer, the term of this patent is extended or adjusted under 35 U.S.C. 154(b) by 378 days.

(21) Appl. No.: 12/518,398

(22) PCT Filed: Jan. 16, 2008

(86) PCT No.: PCT/JP2008/050434
§ 371 (c)(1),
(2), (4) Date: Jun. 9, 2009

(87) PCT Pub. No.: WO2008/087976
PCT Pub. Date: Jul. 24, 2008

(65) Prior Publication Data
US 2010/0044094 A1 Feb. 25, 2010

(30) Foreign Application Priority Data

Jan. 19, 2007 (JP) .................................. 2007-010416
Feb. 27, 2007 (JP) .................................. 2007-047609

(51) Int. Cl.
*H05K 1/11* (2006.01)
(Continued)

(52) U.S. Cl.
CPC .......... *H05K 3/44* (2013.01); *H05K 2203/0315* (2013.01); *H05K 1/097* (2013.01); *H05K 3/4069* (2013.01); *H05K 2203/1136* (2013.01); *H01B 1/22* (2013.01); *H05K 1/056* (2013.01); *H05K 2201/09554* (2013.01); *H05K 2203/105* (2013.01)

USPC .............................. 174/264; 29/831; 174/262

(58) Field of Classification Search
CPC .................................. H01B 1/22; H05K 1/097
USPC ...................................... 174/262, 264; 29/831
See application file for complete search history.

(56) References Cited

U.S. PATENT DOCUMENTS 5,733,467 A * 3/1998 Kawakita et al. ............... 216/18
(Continued)

FOREIGN PATENT DOCUMENTS

JP 05-206596 A 8/1993
(Continued)

OTHER PUBLICATIONS

English machine translation of previously cited JP2006-202359.*
(Continued)

*Primary Examiner* — Bradley Thomas
*Assistant Examiner* — Theron Milliser
(74) *Attorney, Agent, or Firm* — McDermott Will & Emery LLP

(57) ABSTRACT

The printed wiring board 1 includes the metallic substrate 2, the insulating layer 3 provided on the surface of the metallic substrate 2, and the conductive layer 4 formed on the surface of the insulating layer 3. The conductive layer 4 is electrically connected to the metallic substrate 2. A bottomed via hole or a through hole 6 is formed in the insulating layer 3 and the conducive layer 4. The via hole has a bottom in the metallic substrate 2, and has a wall surface in the insulating layer 3 and in the conductive layer 4. The through hole 6 extends through the insulating layer 3, the conductive layer 4, and the metallic substrate 2. Conductive paste 7 fills the bottomed via hole or the through hole 6 to electrically connect the metallic substrate 2 and the conductive layer 4 with each other. The printed wiring board 1 is subjected to a process in which current is applied to the interface between the metallic substrate 2 and the conductive paste 7.

15 Claims, 5 Drawing Sheets

(51) Int. Cl.
  *H05K 3/44* (2006.01)
  *H05K 3/20* (2006.01)
  *H05K 1/09* (2006.01)
  *H05K 3/40* (2006.01)
  *H01B 1/22* (2006.01)
  *H05K 1/05* (2006.01)

(56) References Cited

U.S. PATENT DOCUMENTS

| | | | |
|---|---|---|---|
| 6,096,411 A * | 8/2000 | Nakatani et al. | 428/209 |
| 6,143,116 A | 11/2000 | Hayashi et al. | |
| 6,388,201 B2 | 5/2002 | Yamato et al. | |
| 6,762,921 B1 * | 7/2004 | Asai et al. | 361/111 |
| 6,942,817 B2 | 9/2005 | Yagi et al. | |
| 7,356,916 B2 * | 4/2008 | Nishii et al. | 29/830 |
| 7,760,067 B2 * | 7/2010 | Prusseit et al. | 338/13 |
| 2002/0007961 A1 | 1/2002 | Yamato et al. | |
| 2002/0027127 A1 | 3/2002 | Yagi et al. | |
| 2002/0070412 A1 * | 6/2002 | Mitlehner et al. | 257/401 |
| 2004/0247978 A1 * | 12/2004 | Shimamune | 429/34 |
| 2006/0198081 A1 * | 9/2006 | Seitz et al. | 361/508 |
| 2007/0062925 A1 * | 3/2007 | Park | 219/388 |
| 2007/0246247 A1 | 10/2007 | Ooyabu et al. | |

FOREIGN PATENT DOCUMENTS

| | | |
|---|---|---|
| JP | 05-218605 | 8/1993 |
| JP | 05-243697 A | 9/1993 |
| JP | 10-178249 A | 6/1998 |
| JP | 10-335526 A | 12/1998 |
| JP | 11-054865 A | 2/1999 |
| JP | 11-251751 | 9/1999 |
| JP | 2000-068620 | 3/2000 |
| JP | 2001-352137 | 12/2001 |
| JP | 2002-25028 | 1/2002 |
| JP | 2002-025213 | 1/2002 |
| JP | 2002-076614 A | 3/2002 |
| JP | 2002-094206 | 3/2002 |
| JP | 2006-202359 | 8/2006 |
| JP | 2006-245121 A | 9/2006 |
| JP | 2006-245122 | 9/2006 |
| JP | 2007-294483 A | 11/2007 |

OTHER PUBLICATIONS

English machine translation of previously cited JP11-251751.*
International Preliminary Report on Patentability and Written Opinion of the International Searching Authority, issued in corresponding International Patent Application No. PCT/JP2008/050434, dated Jul. 21, 2009.
Japanese Office Action, with English translation, issued in Japanese Patent Application No. 2007-047609, dated Oct. 18, 2011.
Japanese Office Action issued in Japanese Patent Application No. 2007-047609, dated Jan. 10, 2012.
Japanese Office Action issued in Japanese Patent Application No. 2007-047609 dated Apr. 24, 2012.

* cited by examiner

PRINTED WIRING BOARD AND METHOD FOR MANUFACTURING THE SAME

RELATED APPLICATIONS

This application is the U.S. National Phase under 35 U.S.C. §371 of International Application No. PCT/JP2008/050434, filed on Jan. 16, 2008, which in turn claims the benefit of Japanese Application No. 2007-010416, filed on Jan. 19, 2007 and Japanese Application No. 2007-047609, filed on Feb. 27, 2007, the disclosures of which Applications are incorporated by reference herein.

FIELD OF THE INVENTION

The present invention relates to a printed wiring board used as a substrate for a magnetic head suspension in a hard disk drive, and to a method for manufacturing the printed wiring board.

BACKGROUND OF THE INVENTION

In recent years, as the density of electronic devices is increased and as the sizes electronic devices are reduced, printed wiring boards have been applied to a variety of uses. For example, in a hard disk drive, in which high-speed transfer of data is required, a printed wiring board is used as a substrate for a magnetic head suspension on which a magnetic head is mounted.

Patent Document 1 discloses such a printed wiring board having an insulating layer in which through hole is formed, conductive paste filling the through hole, and a conductive layer formed on either side of the insulating layer. Each conductive layer is formed of copper foil and has a predetermined wiring pattern. Since conductive paste generally has good conductivity, it is widely used for a wide variety of electronic devices. In the printed wiring board, a conductive paste in which conductive filler such as metal powder is dispersed in a binder resin such as epoxy resin is used. The conductive layers formed on both sides of the insulating layer are electrically connected to each other with the conductive paste.

Patent Document 2 discloses a printed wiring board having an insulating layer and a conductive layer formed on either side of the insulating layer. The conductive layers are electrically connected to each other with solder paste. The printed wiring board includes an insulating layer in which through hole is formed, solder paste caused to fill the through hole by reflow soldering, a conductive layer formed either side of the insulating layer. Each conductive layer has a predetermined wiring pattern. In the printed wiring board, the conductive layers formed on both sides of the insulating layer are electrically connected to each other with solder paste.

Patent Document 3 discloses a printed wiring board that is used as a substrate for a magnetic head suspension in the above described hard disk drive. The printed wiring board includes a metallic substrate made, for example, of stainless steel (SUS), an insulating layer laminated on the metallic substrate, and a conductive layer laminated on the insulating layer. The conductive layer is made of copper foil and is formed into a predetermined wiring pattern. Each layer of the printed circuit board is etched to have a predetermined shape.

Patent Document 1: Japanese Laid-Open Patent Publication No. 2000-68620
Patent Document 2: Japanese Laid-Open Patent Publication No. 2002-94206
Patent Document 3: Japanese Laid-Open Patent Publication No. 2002-25213

SUMMARY OF THE INVENTION

Although the above described conductive paste is effective as means for electrically connecting conductive layers made of copper foils to each other, it can hardly be used as means for electrically connecting a metallic substrate and a conductive layer in a printed wiring board for a magnetic head suspension. That is, insulating oxide film is easily formed on the surface of a metallic substrate formed, for example, of stainless steel. Also, organic matter easily collects on the surface. Thus, when electrically connecting a metallic substrate with a conductive layer using conductive paste, insulating layer is likely to be formed at the interface between the conductive paste and the metallic substrate. As a result, since the resistance is increased at the interface between the conductive paste and the metallic substrate, the connection reliability between the metallic substrate and the conductive layer is decreased.

A metallic substrate and a conductive layer may be electrically connected to each other with solder paste. In this case, to remove insulating oxide film on the surface of the metallic substrate, flux needs to be added to the solder paste. However, the use of flux causes insulation deterioration such as migration.

Accordingly, it is an objective of the present invention to provide a printed wiring board that uses conductive paste, thereby achieving a superior connection reliability.

To achieve the foregoing objective and in accordance with a first aspect of the present invention, a printed wiring board including a metallic substrate, an insulating layer, a conductive layer, a bottomed via hole or through hoe, and a conductive paste is provided. The insulating layer is provided on a surface of the metallic substrate. The conductive layer is provided on a surface of the insulating layer, and is electrically connected to the metallic substrate. The via hole is formed in the insulating layer and the conductive layer. The via hole has a bottom in the metallic substrate, and has a wall surface in the insulating layer and in the conductive layer. The through hole extends through the insulating layer, the conductive layer, and the metallic substrate. The conductive paste fills the bottomed via hole or the through hole to electrically connect the metallic substrate and the conductive layer to each other. The printed wiring board is subjected to a process in which current is applied to the interface between the metallic substrate and the conductive paste.

In this configuration, since insulating oxide film and organic matter on the surface of the metallic substrate are destroyed and removed, formation of insulating layer at the interface between the conductive paste and the metallic substrate is effectively inhibited. Therefore, the resistance at the interface between the conductive paste and the metallic substrate is reduced, so that the metallic substance and the conductive layer are reliably connected to each other with the conductive paste. As a result, the connection reliability of the metallic substrate and the conductive layer is improved. Also, since the need for flux when connecting the metallic substrate and the conductive layer to each other is eliminated, insulation deterioration such as migration caused by flux is prevented.

The above printed wiring board is preferably configured such that the metallic substrate is made of at least one selected from the group consisting of stainless steel, aluminum, iron, copper, nickel, titanium, molybdenum, chromium, and zinc. According to this configuration, even in a case where a metallic substrate made, for example, of stainless steel, on which insulating oxide film is easily formed and organic matter easily collects, is used, the resistance at the interface between the conductive paste and the metallic substrate is effectively reduced. As a result, for example, even in a case where a metallic substrate made of stainless steel having superior heat radiating property, spring characteristic, and corrosion resistance is used, the connection reliability between the metallic substance and the conductive layer is improved.

To achieve the foregoing objective and in accordance with a second aspect of the present invention, a printed wiring board including a metallic substrate, an insulating layer, a conductive layer, a bottomed via hole or through hoe, and a conductive paste is provided. The insulating layer is provided on a surface of the metallic substrate. The conductive layer is provided on a surface of the insulating layer, and is electrically connected to the metallic substrate. The via hole is formed in the insulating layer and the conductive layer. The via hole has a bottom in the metallic substrate, and has a wall surface in the insulating layer and in the conductive layer. The through hole extends through the insulating layer, the conductive layer, and the metallic substrate. The conductive paste fills the bottomed via hole or the through hole to electrically connect the metallic substrate and the conductive layer to each other. In the printed wiring board, the metallic substrate is made of stainless steel, and the contact resistance at an interface between the metallic substrate and the conductive paste is 0.03 $\Omega \cdot mm^2$ or less.

Since the contact resistance at the interface between the conductive paste and the metallic substrate is less than or equal to 0.03 $\Omega \cdot mm^2$, the metallic substance and the conductive layer are reliably connected to each other with the conductive paste. As a result, the connection reliability of the metallic substrate and the conductive layer is improved. Also, since the need for flux when connecting the metallic substrate and the conductive layer to each other is eliminated, insulation deterioration such as migration caused by flux is prevented. Further, the use of stainless steel as the material of the metallic substrate provides a printed wiring board having a metallic substrate with superior heat radiating property, spring characteristic, and corrosion resistance.

Further, since the contact resistance at the interface between the conductive paste and the metallic substrate is less than or equal to 0.03 $\Omega \cdot mm^2$, and the connection reliability between the metallic substrate and the conductive layer is improved, this configuration is suitable for a printed wiring board used as a substrate of a suspension in a hard disk drive.

To achieve the foregoing objective and in accordance with a third aspect of the present invention, a printed wiring board including a metallic substrate, an insulating layer, a conductive layer, a bottomed via hole or through hoe, and a conductive paste is provided. The insulating layer is provided on a surface of the metallic substrate. The conductive layer is provided on a surface of the insulating layer, and is electrically connected to the metallic substrate. The via hole is formed in the insulating layer and the conductive layer. The via hole has a bottom in the metallic substrate, and has a wall surface in the insulating layer and in the conductive layer. The through hole extends through the insulating layer, the conductive layer, and the metallic substrate. The conductive paste contains metallic particles and fills the bottomed via hole or the through hole to electrically connect the metallic substrate and the conductive layer to each other. In the printed wiring board, the metallic particles of the conductive paste are anchored to the metallic substrate at an interface between the metallic substrate and the conductive paste.

Since metallic particles in the conductive paste are anchored to the metallic substrate at the interface between the metallic substrate and the conductive paste, the resistance at the interface between the conductive paste and the metallic substrate is reduced. Thus, the metallic substrate and the conductive layer are reliably connected to each other with the conductive paste. As a result, the connection reliability of the metallic substrate and the conductive layer is improved. Also, since the need for flux when connecting the metallic substrate and the conductive layer to each other is eliminated, insulation deterioration such as migration caused by flux is prevented. The "anchorage" refers to a state in which, when a connected part is observed with a cross-sectional scanning microscope, no gap is seen and contacting part is not in points but linearly extends.

In the printed wiring board, it is preferable that the length of a part at which the metallic particles are anchored to the metallic substrate be 0.1 μm or longer.

Since the length of the part at which the metallic particles in the conductive paste and the metallic substrate are anchored to each other is longer than or equal to 0.1 μm, the area through which current flows is large. As a result, the resistance at the interface between the conductive paste and the metallic substrate is further effectively reduced.

The above printed wiring board is preferably configured such that the metallic substrate is made of at least one selected from the group consisting of stainless steel, aluminum, iron, copper, nickel, titanium, molybdenum, chromium, and zinc.

According to this configuration, even in a case where a metallic substrate made, for example, of stainless steel, on which insulating oxide film is easily formed and organic matter easily collects, is used, the resistance at the interface between the conductive paste and the metallic substrate is effectively reduced. As a result, the connection reliability of the metallic substrate and the conductive layer is improved. Particularly, for example, even in a case where a metallic substrate made of stainless steel having superior heat radiating property, spring characteristic, and corrosion resistance is used, the connection reliability between the metallic substance and the conductive layer is improved.

Also, since the metallic particles in the conductive paste and the metallic substrate are anchored to each other at the interface between the metallic substrate and the conductive paste, so that the connection reliability between the metallic substrate and the conductive layer is improved, this configuration is suitable for a printed wiring board used as a substrate of a suspension in a hard disk drive.

To achieve the foregoing object and in accordance with a fourth aspect of the present invention, a method for manufacturing a printed wiring board is provided. The manufacturing method includes at least the steps of: preparing a base fabricated by laminating a metallic substrate, an insulating layer, and a conductive layer; selectively removing the insulating layer, thereby forming a bottomed via hole or a through hole, wherein the via hole has a bottom in the metallic substrate, and has a wall surface in the insulating layer and in the conductive layer, and wherein the through hole extends through the insulating layer, the conductive layer, and the metallic substrate; applying conductive paste to the base thereby filling the through hole with the conducive paste, such that the surface of the metallic substrate that is the bottom of the bottomed via hole or the surface of the metallic substrate in which the through opens is continuous with the surface of the conducive layer that is the wall surface of the through hole; and applying electric current to the interface between the metallic substrate and the conductive paste.

In this configuration, since insulating oxide film and organic matter on the surface of the metallic substrate are destroyed and removed, formation of insulating layer at the interface between the conductive paste and the metallic substrate is effectively inhibited. Therefore, the resistance at the interface between the conductive paste and the metallic substrate is reduced. Thus, the metallic substrate and the conductive layer are reliably connected to each other with the conductive paste. As a result, the connection reliability of the metallic substrate and the conductive layer is improved. Also, since the need for flux when connecting the metallic substrate and the conductive layer to each other is eliminated, insulation deterioration such as migration caused by flux is prevented.

In the method for manufacturing a printed wiring board, it is preferable that the density of the current applied to the interface between the metallic substrate and the conductive paste be 0.1 A/mm$^2$ to 1000 A/mm$^2$. In this configuration, since insulating oxide film and organic matter on the surface of the metallic substrate are destroyed and removed without altering the resin of the conductive paste or melting the metallic substrate due to the heat of current.

In the method for manufacturing a printed board, it is preferable that the period during which the current is applied be $1 \times 10^{-6}$ seconds to 100 seconds. In this configuration, insulating oxide film and organic matter on the surface of the metallic substrate are effectively destroyed and removed without reducing the productivity of the printed wiring board.

DETAILED DESCRIPTION OF THE PREFERRED EMBODIMENTS

A preferred embodiment of the present invention will now be described. A printed wiring board 1 of the present invention is used, for example, as a substrate for a magnetic head suspension on which a magnetic head is mounted in a hard disk drive.

Figure 1:
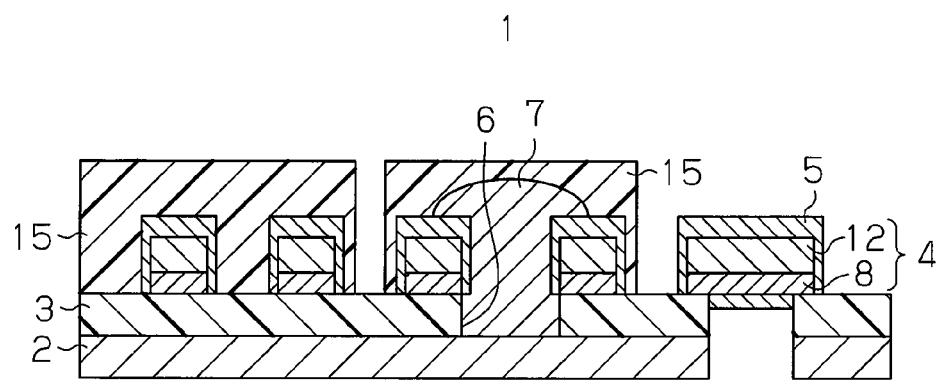
FIG. 1 is a cross-sectional view schematically showing the structure of a printed wiring board according to one embodiment of the present invention.
Figure 2A:
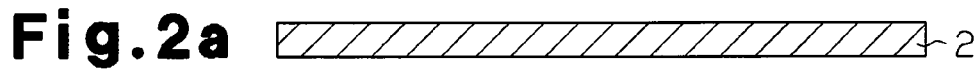
FIGS. 2(a) to 2(h) are cross-sectional views for explaining a method for manufacturing the printed wiring board according to the embodiment of the present invention.
Figure 2B:
Figure 2C:
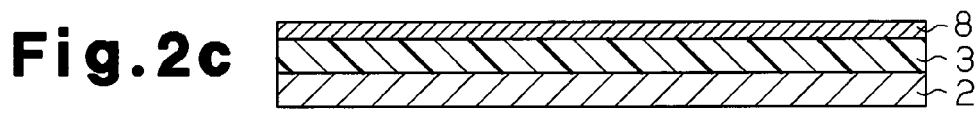
Figure 2D:
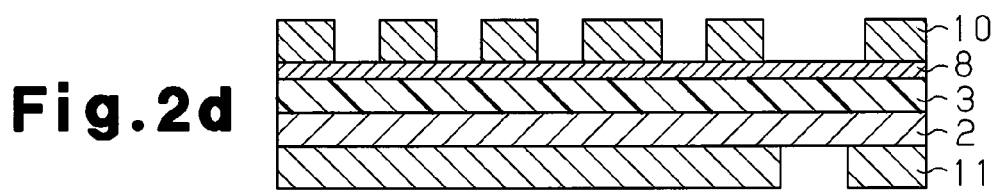
Figure 2E:
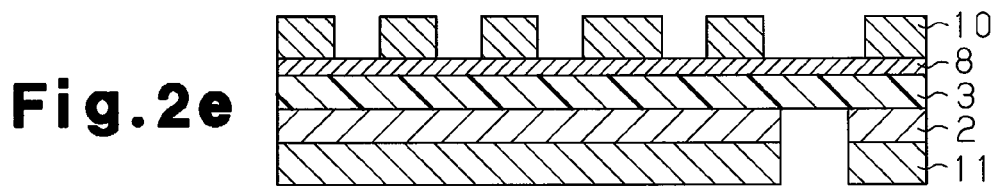
Figure 2F:
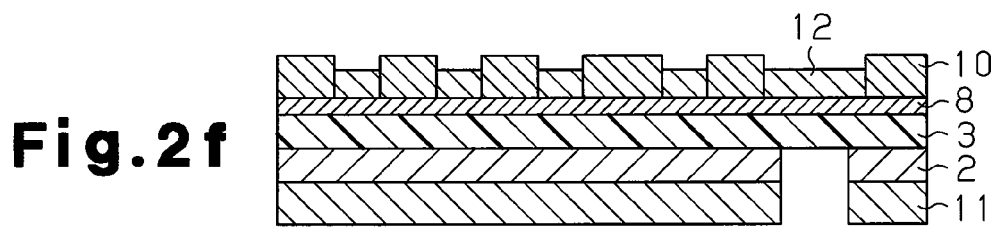
Figure 2G:
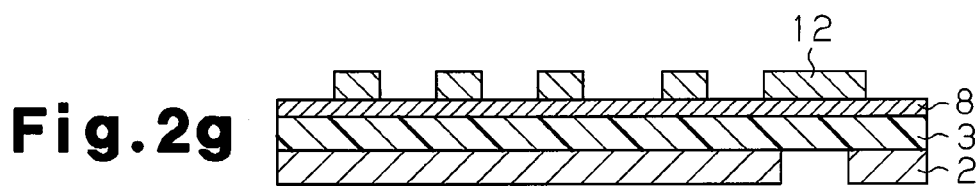
Figure 2H:
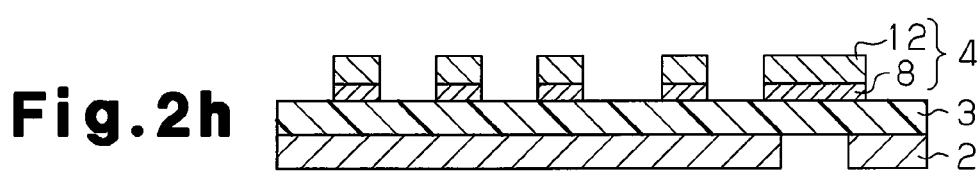

As shown in FIG. 1, the printed wiring board 1 includes a metallic substrate 2 formed of a metal foil, an insulating layer 3 provided on the surface of the metallic substrate 2, and a conductive layer 4 formed on the surface of the insulating layer 3. The conductive layer 4 has predetermined wiring pattern.

The metallic substrate 2 is made, for example, of stainless steel, aluminum, iron, copper, nickel, titanium, molybdenum, chromium, or zinc. Among these, the metal foil is preferably made of stainless steel because of its superior heat radiating property, spring characteristic, and corrosion resistance. The thickness of the metallic substrate 2 is preferably 1 μm to 100 μm.

The insulating layer 3 is made of a resin material having a superior flexibility. As the resin, polyester, which has versatility, is used for the printed wiring board. Particularly, it is preferable to use a resin that has a high heat resistance in addition to flexibility. As such resin film, for example, polyamide-based resin and polyimide-based resin such as polyimide and polyamide-imide are preferable. The thickness of the insulating layer 3 is preferably 5 μm to 200 μm.

The conductive layer 4 is formed on the surface of the insulating layer 3. The conductive layer 4 includes a conductive film 8 forming a base and a plating layer 12 formed on the surface of the conductive film 8. Taking the conductivity and durability into consideration, the conductive film 8 is preferably made, for example, of copper or a copper-based alloy. For example, copper film or a chromium film is used. The plating layer 12 is formed, for example, of copper, aluminum, nickel, gold, solder, or an alloy of these. In view of improving the conductivity, copper is particularly preferable. The thickness of the conductive layer 4 is preferably 2 μm to 50 μm.

To improve the reliability related to the ground connection between the conductive layer 4 and a grounding terminal (not shown), the surface of the conductive layer 4 is coated with a plating layer 5. In consideration of the environment, a lead-free plating layer 5 is preferably used. To prevent the connection reliability between the conductive layer 4 and the terminal from being degraded, a gold plating layer may be used as the lead-free the plating layer 5. Plating to the surface of the conductive layer 4 is performed by electroless plating or electrolytic plating. When forming gold plating layer, nickel plating layer as diffusion preventing layer is first formed on the surface of the exposed conductive layer 4. Gold plating layer is formed on the surface of the nickel plating layer.

A via hole 6 is formed in the printed wiring board 1 to connect the conductive layer 4 to the metallic substrate 2. The via hole 6 is filled with conductive paste 7. The metallic substrate 2 and the conductive layer 4 are electrically connected to each other with the conductive paste 7. Although not illustrated, the via hole 6 may be replaced by a through hole that extends through the insulating layer 3, the conductive layer 4, and the metallic substrate 2. In this case, the metallic substrate 2 and the conductive paste 7 contact each other on the wall surface of the through hole.

The through hole 6 opens on the surface of the metallic substrate 2 and extend through the insulating layer 3 and the conductive layer 4. The diameter of the through hole 6 is preferably 30 to 400 μm, and more preferably 50 to 200 μm. This is because if the diameter is less than 30 μm, the contact area at the through hole 6 is too small, and thus the connection resistance will be excessive when the metallic substrate 2 and the conductive layer 4 are electrically connected to each other. If the diameter is greater than 400 μm, the through hole 6 will be large compared to the width of the traces of the wiring pattern formed on the conductive layer 4, which makes high-density packaging difficult. The cross-sectional shape of the through hole 6 may be other than circular. The cross-sectional shape may be, for example, elliptic or polygonal. When the cross-sectional shape is other than circular, the longest axis of the opening will be referred to as the diameter of the through hole.

As the conductive paste 7, a paste that contains a conductive filler such as metallic powder dispersed in a binder resin is used. As the metallic powder, for example, silver, platinum, gold, copper, nickel, or palladium is used. Among these, because of the superior conductivity, silver powder and silver-coated copper powder are preferable. As the binder resin, for example, epoxy resin, phenol resin, polyester resin, polyurethane resin, acrylic resin, melamine resin, polyimide resin, or polyamide-imide resin is used. Among these, in view of improving the heat resistance of the conductive paste, thermosetting resin is preferably used. In the present embodiment, it is preferable to use epoxy resin.

The type of the epoxy resin is not particularly limited. For example, an epoxy resin of bisphenol A, F, S, or AD type, an epoxy resin of copolymerized bisphenol A type and bisphenol F type, a naphthalene type epoxy resin, a novolac-type epoxy resin, a biphenyl type resin, or a dicyclopentadiene type resin is used. Also, a phenoxy resin, which is a high-molecular weight, may be used.

The binder resin may be dissolved in solvent before use. As the solvent, for example, organic solvent such as ester solvent, ether solvent, ketone solvent, ether ester solvent, alcohol solvent, hydrocarbon solvent, and amine solvent may be used. Since the through hole 6 is filled with the conductive paste 7 by screen printing, it is preferable to use a high-boiling-point solvent that has a superior print performance. More specifically, carbitol acetate or butyl carbitol acetate is preferable. These solvents may be used in combination. These components are mixed with a triple roll mill or rotational agitator-defoamer, such that they are dispersed evenly to obtain the conductive paste.

In the printed wiring board 1, an additional insulating layer 15 is formed on the surface of a part of the conductive layer 4 and on the surface of the conductive paste 7. The additional insulating layer 15 covers a part of the conductive layer 4 and the conductive paste 7. The same material of the insulating layer 3 is used for the additional insulating layer 15.

A procedure for manufacturing the printed wiring board will now be described with reference to the drawings.

First, the metallic substrate 2 is prepared as shown in FIG. 2(*a*). As the metallic substrate 2, for example, the above described metal foil made of stainless steel is used. Next, as shown in FIG. 2(*b*), polyimide cover coat ink is applied to the surfaces of the metallic substrate 2 by screen printing. Then, the applied ink is dried so that the film-like insulating layer 3 made of polyimide-based resin is formed on the surface of the metallic substrate 2.

Subsequently, after a predetermined pattern is formed on the insulating layer 3 using resist, the conductive layer 4 is formed on the surface of the insulating layer 3 by semi-additive process, in which traces are formed by plating. Specifically, the conductive film 8, which is the base of the conductive layer 4, is first formed on the surface of the insulating layer 3 as shown in FIG. 2(*c*). As the conductive film 8, a chromium film or copper film is used. The conductive film 8 is formed by a vacuum film forming method such as sputtering. For example, a chromium film and a copper film may be consecutively formed on the entire surface of the insulating layer 3 by sputtering. The thickness of the chromium film is preferably 10 to 5000 Å, and the thickness of the copper film is preferably 100 to 10000 Å.

Then, as shown in FIG. 2(*d*), on the surface of the conductive film 8, the resist 10 is formed in parts where the conductive layer 4 will not be formed, and the resist 11 is formed on the surface of the metallic substrate 2. The resist 10, 11 is formed by a conventional method such as the dry film resist. Specifically, on the surfaces of the conductive film 8 and the metallic substrate 2 by lamination, an acrylate resin dry film resist can be formed, and a novolac resin resist can be formed by spin coat method. Thereafter, the resist is processed to form the resist 10, 11 having a predetermined opening patterns.

As shown in FIG. 2(*e*), using the resist 11 as a mask, the metallic substrate 2 is selectively removed, for example, by a conventional etching method such as chemical etching (wet etching), so that the metallic substrate 2 has a predetermined shape.

As show in FIG. 2(*f*), using the resist 10 as a mask, the plating layer 12 made, for example, of copper plating is formed on the surface of the conductive film 8 that is exposed through the resist 10 by electroless plating. The thickness of the plating layer 12 is preferably 2 μm to 30 μm.

Then, as shown in FIG. 2(*g*), the resist 10, 11 is removed by using, for example, conventional resist removing liquid. Thereafter, as shown in FIG. 2(*h*), part of the conductive film 8 that has been covered with the resist 10 is removed by a conventional etching method such as chemical etching (wet etching). Accordingly, the conductive layer 4 formed of the conductive film 8 and the plating layer 12 is formed on the surface of the insulating layer 3. In this manner, a base is first fabricated by laminating the metallic substrate 2, the insulating layer 3, and the conductive layer 4.

Then, as shown in FIG. 3(*a*), on the surfaces of the conductive layer 4 and the insulating layer 3, the resist 13 is formed, and resist 14 is formed on the surface of the metallic substrate 2. Like the resist 10, 11, the resist 13, 14 can be formed by a conventional method such as the dry film resist. Specifically, on the surfaces of the conductive film 8 and the metallic substrate 2 by lamination, an acrylate resin dry film resist can be formed, and a novolac resin resist can be formed by spin coat method. Thereafter, the resist is processed to form the resist 13, 14 having a predetermined opening patterns.

As shown in FIG. 3(*b*), by using the resist 13, 14 as masks, for example, the insulating layer 3 is selectively removed by a conventional etching method such as chemical etching (wet etching), so that the through hole 6 for connecting the conductive layer 4 and the metallic substrate 2 are formed.

Then, as shown in FIG. 3(*c*), the resist 13, 14 is removed by using, for example, resist removing liquid.

Then, as shown in FIG. 3(*d*), the surface of the conductive layer 4 is subjected to plating, so that the surface is coated with the plating layer 5. In this case, nickel plating layer as diffusion preventing layer is first formed on the surface of the exposed parts of the conductive layer 4. Then, gold plating layer is formed on the surface of the nickel plating layer.

Next, as shown in FIG. 3(*e*), the through hole 6 is filled with the conductive paste 7. The conductive paste 7 electrically connects the metallic substrate 2 and the conductive layer 4 to each other. The through hole 6 may be filled with the conductive paste 7, for example, by the following method. Specifically, the conductive paste 7 is applied such that the surface of the metallic substrate 2 in which the through hole 6 opens and the surface of the conductive layer 4, which is the wall surface of the through hole 6, are continuous, thereby filling the through hole 6 with the conductive paste 7. After the filling, the conductive paste 7 may be heated and cured as necessary.

The present embodiment is characterized in that, in the state of FIG. 3(*e*) where the through hole 6 has been filled with the conductive paste 7, electrical current is applied to the conductive paste 7 and the metallic substrate 2 in order to reduce the connection resistance. Accordingly, since insulating oxide film and organic matter on the surface of the metallic substrate 2 are destroyed and removed, formation of insulating layer at the interface between the conductive paste 7 and the metallic substrate 2 is effectively inhibited. Therefore, the resistance at the interface between the conductive paste 7 and the metallic substrate 2 is reduced (for example, to a value less than or equal to 1Ω, which effectively inhibits the generation of noise), which allows the conductive paste 7 to reliably connect the metallic substrate 2 and the conductive layer 4 to each other. As a result, the connection reliability between the metallic substrate 2 and the conductive layer 4 is improved, and the use of the conductive paste 7 having a superior conductivity provides the printed wiring board 1 having a superior connection reliability. Unlike the prior art, since the need for flux when connecting the metallic substrate 2 and the conductive layer 4 to each other is eliminated, insulation deterioration such as migration caused by flux is prevented.

The printed wiring board 1 is provided, in which the metallic substrate 2 and the conductive layer 4 are connected to each other with the metallic particles contained in the conductive paste 7 anchored to the metallic substrate 2 at the interface between the metallic substrate 2 and the conductive paste 7. Therefore, the printed wiring board 1 is provided, which has a superior connection reliability between the metallic substrate 2 and the conductive layer 4 and is particularly suitable as a substrate used for a suspension in a hard disk drive.

In view of increasing the size of a part through which current flows thereby reducing the resistance value, the length of the part at which the metallic particles of the conductive paste 7 are anchored to the metallic substrate 2 is preferably longer than or equal to 0.1 μm.

Also, the printed wiring board 1 is provided, in which stainless steel is used as the material of the metallic substrate 2, the contact resistance at the interface between the conductive paste 7 and the metallic substrate 2 is 0.03 Ω·mm² or less, and the connection reliably between the metallic substrate 2 and the conductive layer 4 is improved. Particularly, the printed wiring board 1 that is suitable as a substrate for a suspension used in a hard disk drive is provided.

The current density of the current applied to the surface of the metallic substrate 2 in which the through hole 6 is opened (that is, the interface between the conductive paste 7 and the metallic substrate 2) is preferably 0.1 A/mm² to 1000 A/mm². This is because if the current density is less than 0.1 A/mm², the insulating oxide film and organic matter on the surface of the metallic substrate 2 will not be easily destroyed and removed. Also, if the current density is greater than 1000 A/mm², the heat caused by the current can alter the resin forming the conductive paste 7 or melt and exfoliate the metallic substrate 2.

As the current applied to the interface between the conductive paste 7 and the metallic substrate 2, a direct current, an alternating current, or a pulse current may be used. These types of currents may used in combination. When applying a current of 0.1 A/mm² to 1000 A/mm², time during which the current is applied (application period) is preferably $1 \times 10^{-6}$ seconds to 100 seconds. This is because if the application period is shorter than $1 \times 10^{-6}$ seconds, the insulating oxide film and organic matter on the surface of the metallic substrate 2 will not be easily destroyed and removed. If the application period is longer than 100 seconds, time required for fabricating the printed wiring board 1 will be too long, and the productivity of the printed wiring board 1 will be lowered.

Figure 3A:
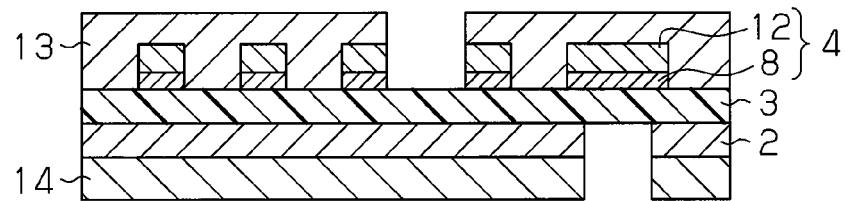
FIGS. 3(a) to 3(f) are cross-sectional views for explaining a method for manufacturing the printed wiring board according to the embodiment of the present invention, showing steps subsequent to those of FIGS. 2(a) to 2(h)
Figure 3B:
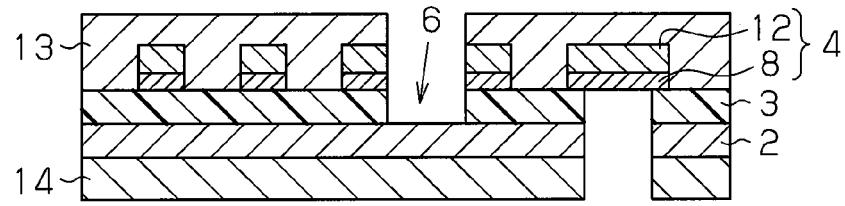
Figure 3C:
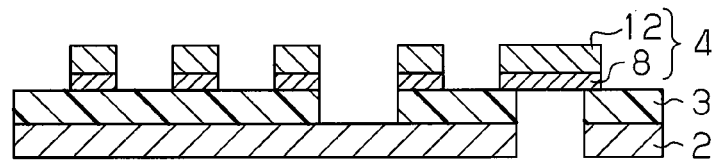
Figure 3D:
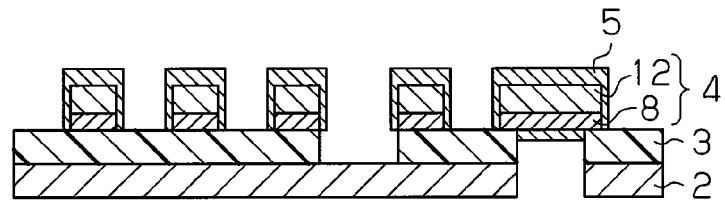
Figure 3E:
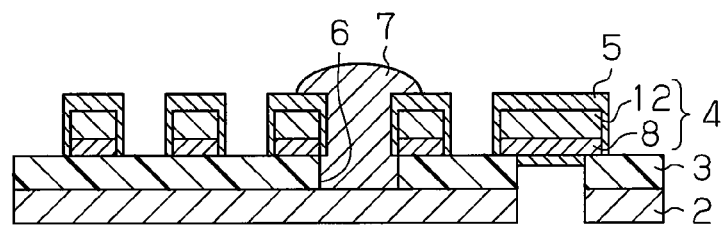
Figure 3F:
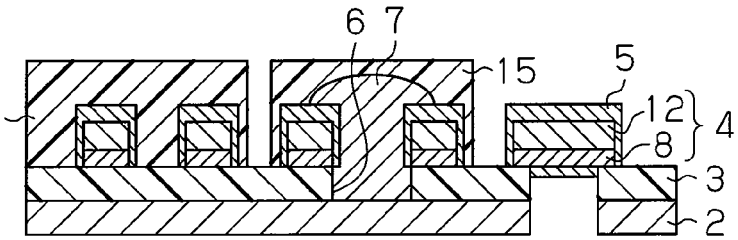

Then, as shown in FIG. 3(f), the additional insulating layer 15 is laminated on the surface of a part of the conductive layer 4 to cover the part of the conductive layer 4 and the conductive paste 7. The printed wiring board 1 is thus completed. Insulating layers may be formed, for example, by the following method. First, photosensitive polyimide cover coat ink is applied by the screen printing and dried. The cover coat ink is then exposed and developed to form the film-like additional insulating layer 15 made of polyimide resin on the surface of a part of the conductive layer 4 and the surface of the conductive paste 7.

The present embodiment has the advantages described below.

(1) The printed wiring board 1 includes the metallic substrate 2, the insulating layer 3 provided on the surface of the metallic substrate 2, and the conductive layer 4 formed on the surface of the insulating layer 3. The conductive layer 4 is electrically connected to the metallic substrate 2. The through hole 6 is formed in the insulating layer 3 and the conductive layer 4 so as to extend through the insulating layer 3 and the conductive layer 4, and open in the metallic substrate 2. The through hole 6 is filled with the conductive paste 7 for electrically connecting the metallic substrate 2 and the conductive layer 4 to each other. The printed wiring board 1 is subjected to a process in which current is applied to the interface between the metallic substrate 2 and the conductive paste 7. This destroys and removes insulating oxide film and organic matter on the surface of the metallic substrate 2, and reduces the resistance at the interface between the conductive paste 7 and the metallic substrate 2. As a result, the use of the conductive paste 7 having a superior conductivity improves the connection reliability between the metallic substrate 2 and the conductive layer 4. Also, since the need for flux is eliminated, insulation deterioration such as migration caused by flux is prevented.

(2) The printed wiring board 1 includes the metallic substrate 2, the insulating layer 3 provided on the surface of the metallic substrate 2, and the conductive layer 4 formed on the surface of the insulating layer 3. The conductive layer 4 is electrically connected to the metallic substrate 2. The through hole 6 is formed in the insulating layer 3 and the conductive layer 4 so as to open in the metallic substrate 2 and extend through the insulating layer 3 and the conductive layer 4. The through hole 6 is filled with the conductive paste 7 for electrically connecting the metallic substrate 2 and the conductive layer 4 to each other. Further, in the printed wiring board 1, the metallic substrate 2 is made of stainless steel, and the contact resistance at the interface between the conductive paste 7 and the metallic substrate 2 is 0.03 Ω·mm² or less. Therefore, the use of the conductive paste 7 having a superior conductivity improves the connection reliability between the stainless steel metallic substrate 2 and the conductive layer 4. Also, since the need for flux is eliminated, insulation deterioration such as migration caused by flux is prevented. Further, the use of stainless steel as the material of the metallic substrate 2 provides a printed wiring board 1 having a metallic substrate with superior heat radiating property, spring characteristic, and corrosion resistance.

(3) Since the contact resistance at the interface between the conductive paste 7 and the metallic substrate 2 is less than or equal to 0.03 Ω·mm², and the connection reliability between the metallic substrate 2 and the conductive layer 4 is improved, the printed wiring board 1 is particularly suitable for a printed wiring board used as a substrate of a suspension in a hard disk drive.

(4) The printed wiring board 1 includes the metallic substrate 2, the insulating layer 3 provided on the surface of the metallic substrate 2, and the conductive layer 4 formed on the surface of the insulating layer 3. The conductive layer 4 is electrically connected to the metallic substrate 2. The through hole 6 is formed in the insulating layer 3 and the conductive layer 4 so as to extend through the insulating layer 3 and the conductive layer 4, and opens in the metallic substrate 2. The through hole 6 is filled with the conductive paste 7 that contains metallic particles and electrically connects the metallic substrate 2 and the conductive layer 4 to each other. The metallic particles contained in the conductive paste 7 are anchored to the metallic substrate 2 at the interface between the metallic substrate 2 and the conductive paste 7. Therefore, the resistance at the interface between the conductive paste 7 and the metallic substrate 2 is reduced, so that the metallic substance 2 and the conductive layer 7 are reliably connected to each other with the conductive paste 7. As a result, the connection reliability of the metallic substrate 2 and the conductive layer 4 is improved. Also, since the need for flux when connecting the metallic substrate 2 and the conductive layer 4 to each other is eliminated, insulation deterioration such as migration caused by flux is prevented.

(5) The length of the part at which the metallic particles of the conductive paste 7 are anchored to the metallic substrate 2 is longer than or equal to 0.1 μm. Therefore, the resistance at the interface between the conductive paste 7 and the metallic substrate 2 is further effectively reduced.

(6) Since the metallic particles in the conductive paste 7 are anchored to the metallic substrate 2 at the interface between the metallic substrate 2 and the conductive paste 7, so that the connection reliability between the metallic substrate 2 and the conductive layer 4 is improved, this configuration is suitable for a printed wiring board used as a substrate of a suspension in a hard disk drive.

(7) The metallic substrate 2 is made of at least one selected from the group consisting of stainless steel, aluminum, iron, copper, nickel, titanium, molybdenum, chromium, and zinc. Therefore, even in a case where a metallic substrate 2 made, for example, of stainless steel, on which insulating oxide film is easily formed and organic matter easily collects, is used, the resistance at the interface between the conductive paste 7 and the metallic substrate 2 is effectively reduced. As a result, for example, even in a case where a metallic substrate 2 made of stainless steel having superior heat radiating property, spring characteristic, and corrosion resistance is used, the connection reliability between the metallic substance 2 and the conductive layer 4 is improved.

(8) The method for manufacturing the printed wiring board 1 includes: preparing a base fabricated by laminating the metallic substrate 2, the insulating layer 3, and the conductive layer 4; selectively removing the insulating layer 3, thereby forming the through hole 6 extending through the insulating layer 3 and the conductive layer 4, the through hole 6 opening in the metallic substrate 2; and applying the conductive paste 7, such that the surface of the metallic substrate 2, in which the through hole 6 opens, and the surface of the conductive layer 4, which is the wall surface of the through hole 6, are continuous, thereby filling the through hole 6 with the conductive paste 7. The method for manufacturing the printed wiring board 1 according to the present embodiment further includes applying current to the interface between the metallic substrate 2 and the conductive paste 7. This destroys and removes insulating oxide film and organic matter on the surface of the metallic substrate 2, and reduces the resistance at the interface between the conductive paste 7 and the metallic substrate 2. As a result, the use of the conductive paste 7 having a superior conductivity improves the connection reliability between the metallic substrate 2 and the conductive layer 4. Also, since the need for flux is eliminated, insulation deterioration such as migration caused by flux is prevented.

(9) The current density of the current applied to the interface between the metallic substrate 2 and the conductive paste 7 is 0.1 A/mm$^2$ to 1000 A/mm$^2$. Accordingly, since insulating oxide film and organic matter on the surface of the metallic substrate 2 are destroyed and removed without altering the resin of the conductive paste 7 or melting the metallic substrate 2 due to the heat of current.

(10) A current of which the density is 0.1 A/mm$^2$ to 1000 A/mm$^2$ is applied for $1 \times 10^{-6}$ to 100 seconds. Accordingly, insulating oxide film and organic matter on the surface of the metallic substrate 2 are effectively destroyed and removed without reducing the productivity of the printed wiring board 1.

The present invention is not limited to the foregoing embodiment, but may be modified as follows without departing from the scope of the invention.

For example, latent hardener may be added to the conductive paste 7, in which conductive filler is dispersed in binder resin. In this case, for example, if a polyester resin is used as the binder resin, isocyanate compound may be used. If an epoxy resin is used, amine compound or imidazole compound may be used.

In the above embodiment, polyimide cover coat ink is applied by screen printing and dried to form the film-like insulating layer 3 made of a polyimide resin on the surface of the metallic substrate 2. However, an adhesive layer (not shown) may be formed on one side of the insulating layer 3, which is a resin film, and the metallic substrate 2 and the insulating layer 3 may be bonded to each other with means of the adhesive layer.

EXAMPLES

The present invention will now be described based on Examples and Comparative Examples. The present invention is not limited to these Examples. The Examples may be changed or modified based on the spirit of the present invention, and the changes and modifications are not excluded from the scope of the present invention.

(Fabrication of Printed Wiring Board)

Figure 4:
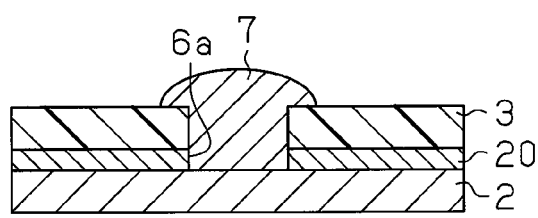
FIG. 4 is a cross-sectional view schematically showing the structure of a printed wiring board according to Example 1.

The following description is made with reference to FIG. 4. First, as a metallic substrate 2, a stainless steel metal foil (SUS304HTA) having a thickness of 20 μm was prepared. As an insulating layer 3, a polyimide resin film having a thickness of 12 μm was prepared. An adhesive layer 20 made of a thermosetting resin containing an epoxy resin was formed on the resin film, and an opening having a diameter (opening diameter) of 0.4 mm was formed in the resin film. Next, the metallic substrate 2 and the insulating layer 3 were bonded to each other with the adhesive layer 20 to form a bonded body of the metallic substrate 2 and the insulating layer 3. A through hole 6a was formed in the bonded body. The through hole 6a was opened in the metallic substrate 2, and extended through the insulating layer 3, on which the adhesive layer 20 was provided (the through hole 6a corresponds to the through hole 6 in the above described embodiment). Then, conductive paste 7 was applied such that the surface of the metallic substrate 2, in which the through hole 6a opened, and the surface of the insulating layer 3, which was the wall surface of the through hole 6a, are continuous, thereby filling the through hole 6a with the conductive paste 7.

The conductive paste 7 was prepared by dissolving 100 parts by weight of an epoxy resin of bisphenol A type (epoxy equivalent of 7000 to 8500) in butyl carbitol acetate, adding to the solution 1 part by weight of imidazole latent hardener, and adding silver particles to the solution such that the silver particles accounted for 60 vol % of the total dissolved solid.

The filling conductive paste 7 was heat-treated (180° C., 30 minutes) to be hardened, thereby fabricating a printed wiring board 30 shown in FIG. 4. The contact area at the interface between the metallic substrate 2 and the conductive paste 7 was 0.1256 mm².

(Measurement of Initial Resistance and Initial Contact Resistance)

As shown in FIG. 4, the metallic substrate 2 and the conductive paste 7 were electrically connected to each other, and the resistance of the metallic substrate 2 and the conductive paste 7 at the through hole 6a (hereinafter, referred to as initial resistance) was measured, and the contact resistance of the metallic substrate 2 and the conductive paste 7 at the through hole 6a (hereinafter, referred to as initial contact resistance) was measured by the four-terminal sensing. The results are shown in Table 1. Due to the limitation of the four-terminal sensing, the contact resistance contained the resistance at the through hole 6a.

Example 1

In the fabricated printed wiring board 30, current of 1 A (that is, a current density of 8.0 A/mm²) was applied for one second to the interface between the metallic substrate 2 and the conductive paste 7, and the resistance of the metallic substrate 2 and the conductive paste 7 at the through hole 6a (hereinafter, referred to as resistance after current application) was measured, and the contact resistance of the metallic substrate 2 and the conductive paste 7 at the through hole 6a (hereinafter, referred to as contact resistance after current application) was measured by four-terminal sensing. The results are shown in Table 1.

Example 2

In the fabricated printed wiring board 30, current of 2 A (that is, a current density of 15.9 A/mm²) was applied for one second to the interface between the metallic substrate 2 and the conductive paste 7, and the resistance of the metallic substrate 2 and the conductive paste 7 at the through hole 6a after the current application and the contact resistance after the current application were measured by four-terminal sensing. The results are shown in Table 1.

Example 3

In the fabricated printed wiring board 30, current of 2 A (that is, a current density of 23.9 A/mm²) was applied for one second to the interface between the metallic substrate 3 and the conductive paste 7, and the resistance of the metallic substrate 2 and the conductive paste 7 at the through hole 6a after the current application and the contact resistance after the current application were measured by four-terminal sensing. The results are shown in Table 1.

Example 4

In the fabricated printed wiring board 30, current of 2 A (that is, a current density of 31.8 A/mm²) was applied for one second to the interface between the metallic substrate 4 and the conductive paste 7, and the resistance of the metallic substrate 2 and the conductive paste 7 at the through hole 6a after the current application and the contact resistance after the current application were measured by four-terminal sensing. The results are shown in Table 1.

(Fabrication of Printed Wiring Board and Measurement of Initial Resistance and Initial Contact Resistance)

A stainless steel metal foil (SUS304HTA), or the metallic substrate 2, was immersed in hydrochloric acid aqueous solution of 20% for 10 minutes and was washed with water. Thereafter, a printed wiring board 30 was fabricated by the same method as described above, and the initial resistance and the initial contact resistance were measured. The results are shown in Table 2. The contact area at the interface between the metallic substrate 2 and the conductive paste 7 was 0.1256 mm². Also, due to the limitation of the four-terminal sensing, the contact resistance contained the resistance at the through hole 6a.

Example 5

In the printed wiring board 30, which was fabricated by using the metallic substrate 2 that had been immersed in a hydrochloric acid aqueous solution of 20%, current of 1 A (that is, a current density of 8.0 A/mm²) was applied for one second to the interface between the metallic substrate 2 and the conductive paste 7, and the resistance of the metallic substrate 2 and the conductive paste 7 at the through hole 6a after the current application and the contact resistance after the current application were again measured by four-terminal sensing. The results are shown in Table 2.

Example 6

In the printed wiring board 30, which was fabricated by using the metallic substrate 2 that had been immersed in a hydrochloric acid aqueous solution of 20%, current of 2 A (that is, a current density of 15.9 A/mm²) was applied for one second to the interface between the metallic substrate 2 and the conductive paste 7, and the resistance of the metallic substrate 2 and the conductive paste 7 at the through hole 6a after the current application and the contact resistance after the current application were measured by four-terminal sensing. The results are shown in Table 2.

Example 7

In the printed wiring board 30, which was fabricated by using the metallic substrate 2 that had been immersed in a hydrochloric acid aqueous solution of 20%, current of 2 A (that is, a current density of 23.9 A/mm²) was applied for one second to the interface between the metallic substrate 3 and the conductive paste 7, and the resistance of the metallic substrate 2 and the conductive paste 7 at the through hole 6a after the current application and the contact resistance after the current application were measured by four-terminal sensing. The results are shown in Table 2.

Example 8

In the printed wiring board 30, which was fabricated by using the metallic substrate 2 that had been immersed in a hydrochloric acid aqueous solution of 20%, current of 2 A (that is, a current density of 31.8 A/mm²) was applied for one second to the interface between the metallic substrate 4 and the conductive paste 7, and the resistance of the metallic substrate 2 and the conductive paste 7 at the through hole 6a after the current application and the contact resistance after the current application were measured by four-terminal sensing. The results are shown in Table 2.

(Fabrication of Printed Wiring Board)

Figure 5:
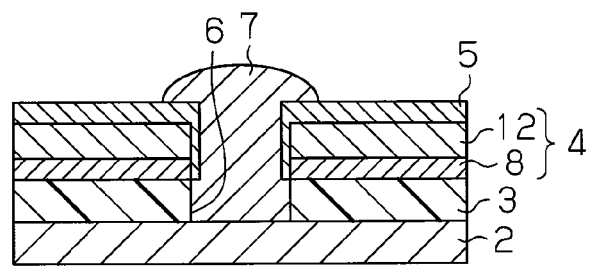
FIG. 5 is a cross-sectional view schematically showing the structure of a printed wiring board according to Example 9.

The following description is made with reference to FIG. 5. First, as a metallic substrate 2, a stainless steel metal foil (SUS304HTA) having a thickness of 20 μm was prepared. Polyimide cover coat ink was applied to the surface of the metallic substrate 2 by screen printing and dried to form a film-like insulating layer 3 made of a polyimide resin. Next, a conductive film 8 that had a thickness of 0.2 μm and was primarily formed of copper was formed on the surface of the insulating layer 3 by sputtering. Then, a plating layer 12 made of copper was formed on the surface of the conductive film 8 by electroless plating. Subsequently, the conductive film 8 was removed by chemical etching (wet etching), and a conductive layer 4 formed by the conductive film 8 and the plating layer 12 was formed on the surface of the insulating layer 3 by semi-additive process. The insulating layer 3 was then selectively removed by chemical etching (wet etching) using strong alkaline solution to form a through hole 6 (diameter: 0.165 mm) for connecting the conductive layer 4 and the metallic substrate 2 to each other. Next, after nickel plating layer as diffusion preventing layer was formed on the surface of the conductive layer 4, gold plating layer was formed on the surface of the nickel plating layer, so that the surface of the conductive layer 4 was covered with a plating layer 5. Then, conductive paste 7 was applied such that the surface of the metallic substrate 2, in which the through hole 6 opened, and the surface of the conductive layer 4, which was the wall surface of the through hole 6, are continuous, thereby filling the through hole 6a with the conductive paste 7. The same conductive paste that was used for fabricating the above described printed wiring board 30 was used as the conductive paste 7.

The filling conductive paste 7 was heat-treated (180° C., 30 minutes) to be harden, thereby fabricating a printed wiring board 40 shown in FIG. 5. The contact area at the interface between the metallic substrate 2 and the conductive paste 7 was 0.0214 mm$^2$.

(Measurement of Initial Resistance and Initial Connection Resistance)

As shown in FIG. 5, the metallic substrate 2 and the conductive paste 7 were electrically connected to each other, and the resistance at the through hole 6 (hereinafter, referred to as initial resistance) was measured, and the connection resistance at the through hole 6 (hereinafter, referred to as initial connection resistance) was measured by four-terminal sensing. The results are shown in Table 3.

Example 9

In the fabricated printed wiring board 40, current of 10 mA (that is, a current density of 0.5 A/mm$^2$) was applied for two seconds to the interface between the metallic substrate 2 and the conductive paste 7, and the resistance at the through hole 6a (hereinafter, referred to as resistance after current application) was measured, and the connection resistance at the through hole 6a (hereinafter, referred to connection resistance after current application) was measured by four-terminal sensing. The results are shown in Table 3.

The initial connection resistance and the connection resistance after current application are each considered to be the sum of the contact resistance of the metallic substrate 2 and the conductive paste 7, the contact resistance of the plating layer 5 and the conductive paste 7, and the resistance of the conductive paste 7.

Example 10

In the fabricated printed wiring board 40, current of 30 mA (that is, a current density of 1.4 A/mm$^2$) was applied for two seconds to the interface between the metallic substrate 2 and the conductive paste 7, and the resistance at the through hole 6 after the current application and the connection resistance after the current application were measured by four-terminal sensing. The results are shown in Table 3.

Example 11

In the fabricated printed wiring board 40, current of 100 mA (that is, a current density of 4.7 A/mm$^2$) was applied for two seconds to the interface between the metallic substrate 2 and the conductive paste 7, and the resistance at the through hole 6 after the current application and the connection resistance after the current application were measured by four-terminal sensing. The results are shown in Table 3.

Example 12

In the fabricated printed wiring board 40, current of 200 mA (that is, a current density of 9.4 A/mm$^2$) was applied for two seconds to the interface between the metallic substrate 2 and the conductive paste 7, and the resistance at the through hole 6 after the current application and the connection resistance after the current application were measured by four-terminal sensing. The results are shown in Table 3.

Example 13

In the fabricated printed wiring board 40, current of 500 mA (that is, a current density of 23.4 A/mm$^2$) was applied for two seconds to the interface between the metallic substrate 2 and the conductive paste 7, and the resistance at the through hole 6 after the current application and the connection resistance after the current application were measured by four-terminal sensing. The results are shown in Table 3.

(Evaluation of Conductive Paste and Metallic Substrate)

Figure 6:
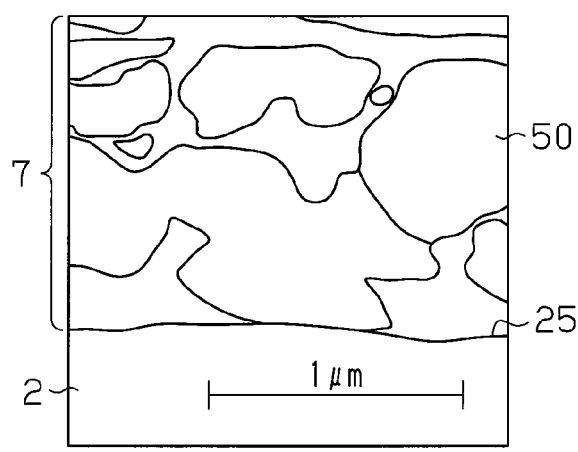
FIG. 6 is a cross-sectional structure diagram as observed with a scanning electron microscope, showing the interface between the conductive paste and the metallic substrate in a printed wiring board that has been treated with current.
Figure 7:
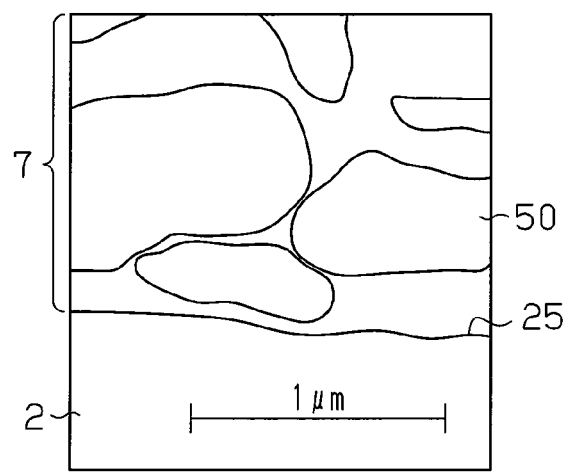
FIG. 7 is a cross-sectional structure diagram as observed with a scanning electron microscope, showing the interface between the conductive paste and the metallic substrate in a printed wiring board that has not been treated with current.

The printed wiring board 40 of Example 10, in which a current of 30 mA was applied for two seconds to the interface between the metallic substrate 2 and the conductive paste 7 was cut along the axis of the through hole 6 by using a cross section polisher (SM-09010 manufactured by Japan Electron Optics Laboratory Co.). The interface between the conductive paste 7 and the metallic substrate 2 at the vertical cross-section of the through hole 6 was observed with an SEM (Scanning Electron Microscope, trade name: S-800 manufactured by Hitachi High-Technologies Corporation). The cross-sectional structure of the interface between the conductive paste 7 and the metallic substrate 2 is shown in FIG. 6. As in the case of the above printed wiring board 40, a printed wiring board 40 that was not treated with current (that is, a printed wiring board 40 prior to application of a current of 30 mA) was cut. The interface between the conductive paste 7 and the metallic substrate 2 at the vertical cross-section of the through hole 6 was observed by using an SEM. The cross-sectional structure of the interface between the conductive paste 7 and the metallic substrate 2 is shown in FIG. 7.

TABLE 1

| | Initial Resistance (Ω) | Initial Contact Resistance (Ω·mm²) | Resistance after Current Application (Ω) | Contact Resistance after Current Application (Ω·mm²) | Current Value (A) | Current Density (A/mm²) |
|---|---|---|---|---|---|---|
| Initial (Before Current Application) | 1.20 | 0.1500 | — | — | — | — |
| Example 1 | | | 0.19 | 0.0239 | 1 | 8.0 |
| Example 2 | | | 0.12 | 0.0151 | 2 | 15.9 |
| Example 3 | | | 0.12 | 0.0151 | 3 | 23.9 |
| Example 4 | | | 0.10 | 0.0126 | 4 | 31.8 |

TABLE 2

| | Initial Resistance (Ω) | Initial Contact Resistance (Ω·mm²) | Resistance after Current Application (Ω) | Contact Resistance after Current Application (Ω·mm²) | Current Value (A) | Current Density (A/mm²) |
|---|---|---|---|---|---|---|
| Initial (Before Current Application) | 1.50 | 0.1884 | — | — | — | — |
| Example 5 | | | 0.20 | 0.0251 | 1 | 8.0 |
| Example 6 | | | 0.18 | 0.0226 | 2 | 15.9 |
| Example 7 | | | 0.19 | 0.0239 | 3 | 23.9 |
| Example 8 | | | 0.13 | 0.0163 | 4 | 31.8 |

TABLE 3

| | Initial Resistance (Ω) | Initial Contact Resistance (Ω·mm²) | Resistance after Current Application (Ω) | Contact Resistance after Current Application (Ω·mm²) | Current Value (A) | Current Density (A/mm²) |
|---|---|---|---|---|---|---|
| Initial (Before Current Application) | 1.90 | 0.0406 | — | — | — | — |
| Example 9 | | | 0.90 | 0.0192 | 0.01 | 0.5 |
| Example 10 | | | 0.14 | 0.0030 | 0.03 | 1.4 |
| Example 11 | | | 0.15 | 0.0032 | 0.1 | 4.7 |
| Example 12 | | | 0.06 | 0.0013 | 0.2 | 9.4 |
| Example 13 | | | 0.07 | 0.0015 | 0.5 | 23.4 |

As indicated by Table 1, the contact resistance after current application was significantly lower than the initial contact resistance (0.15 Ω·mm²) in any of Examples 1 to 4. Also, as indicated by Table 2, the contact resistance after current application was significantly lower than the initial contact resistance (0.1883 Ω·mm²) in any of Examples 5 to 8. Further, the connection resistance after current application was significantly lower than the initial connection resistance (0.0406 Ω·mm²) in any of Examples 9 to 13. Accordingly, it was confirmed that the application of current to the interface between the metallic substrate 2 and the conductive paste 7 increased the connection reliability between the metallic substrate 2 and the conductive layer 4.

As shown in FIG. 6, in the case of the printed wiring board 40 of Example 10, in which a current of 30 mA was applied for two seconds, metallic particles 50 of the conductive paste 7 were anchored to the metallic substrate 2. Also, the length of the part at which the metallic particles 50 of the conductive paste 7 were anchored to the metallic substrate 2 was longer than or equal to 0.1 μm. In contrast, as shown in FIG. 7, in the case of the printed wiring board 40 that was not treated with current, metallic particles 50 of the conductive paste 7 were not anchored to the metallic substrate 2.

INDUSTRIAL APPLICABILITY

The applications of the present invention include a printed wiring board used as a substrate for a magnetic head suspension in a hard disk drive, and a method for manufacturing the printed wiring board.

The invention claimed is:

1. A printed wiring board that is a substrate for a suspension in a hard disk drive, the printed wiring board comprising:
   a metallic substrate;
   an insulating layer provided on a surface of the metallic substrate;
   a conductive layer provided on a surface of the insulating layer, the conductive layer being electrically connected to the metallic substrate;
   a via hole formed in the insulating layer and the conductive layer, wherein the via hole has a bottom in the metallic substrate, and has a wall surface in the insulating layer and in the conductive layer; and
   a conductive paste that fills the via hole to electrically connect the metallic substrate and the conductive layer to each other,
   wherein the conductive layer includes a conductive film formed on the surface of the insulating layer,
   wherein the metallic substrate is made of stainless steel, and the conductive paste is composed of an epoxy resin of bisphenol A, butyl carbitol acetate and imidazole latent hardener and silver particles,
   wherein the printed wiring board has been subjected to a process in which electrical current is applied to an interface between the metallic substrate and the conductive paste, the contact resistance at the interface between the metallic substrate and the conductive paste is 0.03 $\Omega \cdot mm^2$ or less,
   wherein the via hole has a first portion formed in the insulating layer and a second portion formed in the conductive layer, the second portion being stacked on the first portion along an axis direction of the via hole,
   wherein the conductive paste is in contact with the insulating layer within the via hole, and
   the length of a part at which the silver particles are anchored to the metallic substrate is 0.1 μm or longer and 0.6 μm or shorter.

2. The printed wiring board according to claim 1, wherein the conductive layer is covered by a plated metal layer.

3. The printed wiring board according to claim 2, wherein the plated metal layer is contact with the conductive paste in the via hole.

4. The printed wiring board according to claim 1, further comprising:
   a through hole passing through the insulating layer, the conductive layer, and the metallic substrate,
   wherein the through hole is filled with the conductive paste and is electrically connected to the metallic substrate and the conductive layer.

5. The printed wiring board according to claim 1, wherein a diameter of the first portion is larger than a diameter of the second portion.

6. A printed wiring board that is a substrate for a suspension in a hard disk drive, the printed wiring board comprising:
   a metallic substrate;
   an insulating layer provided on a surface of the metallic substrate;
   a conductive layer provided on a surface of the insulating layer, the conductive layer being electrically connected to the metallic substrate;
   a via hole formed in the insulating layer and the conductive layer, wherein the via hole has a bottom in the metallic substrate, and has a wall surface in the insulating layer and in the conductive layer; and
   a conductive paste that fills the via hole to electrically connect the metallic substrate and the conductive layer to each other,
   wherein the conductive layer includes a conductive film formed on the surface of the insulating layer,
   wherein the metallic substrate is made of stainless steel,
   wherein the conductive paste is composed of an epoxy resin of bisphenol A, butyl carbitol acetate and imidazole latent hardener and silver particles,
   wherein the printed wiring board has been subjected to a process in which electrical current is applied to an interface between the metallic substrate and the conductive paste, the contact resistance at an interface between the metallic substrate and the conductive paste is 0.03 $\Omega \cdot mm^2$ or less,
   wherein the length of a part at which the silver particles are anchored to the metallic substrate is 0.1 μm or longer and 0.6 μm or shorter,
   wherein the metallic particles of the conductive paste are anchored to the metallic substrate at an interface between the metallic substrate and the conductive paste,
   wherein the via hole has a first portion formed in the insulating layer and a second portion formed in the conductive layer, the second portion being stacked on the first portion along an axis direction of the via hole, and
   wherein the conductive paste is in contact with the insulating layer within the via hole.

7. The printed wiring board according to claim 6, wherein the conductive layer is covered by a plated metal layer.

8. The printed wiring board according to claim 6, further comprising:
   a through hole passing through the insulating layer, the conductive layer, and the metallic substrate,
   wherein the through hole is filled with the conductive paste and is electrically connected to the metallic substrate and the conductive layer.

9. The printed wiring board according to claim 6, wherein a diameter of the first portion is larger than a diameter of the second portion.

10. A method for manufacturing a printed wiring board that is a substrate for a suspension in a hard disk drive, the printed wiring board, the method comprising at least the steps of:
    preparing a base fabricated by laminating a metallic substrate, an insulating layer, and a conductive layer, the metallic substrate being made of stainless steel, the conductive layer including a conductive film formed on a surface of the insulating layer;
    selectively removing the insulating layer, thereby forming a via hole, wherein the via hole has a bottom in the metallic substrate, and has a wall surface in the insulating layer and in the conductive layer;
    filling the via hole with a conductive paste such that a surface of the metallic substrate that is a bottom of the via hole is continuous with a surface of the conducive layer that is the wall surface of the via hole, the conductive paste being composed of an epoxy resin of bisphenol A, butyl carbitol acetate and imidazole latent hardener and silver particles; and
    applying electric current to the interface between the metallic substrate and the conductive paste so that the contact resistance at an interface between the metallic substrate and the conductive paste is 0.03 $\Omega \cdot mm^2$ or less,
    wherein the length of a part at which the silver particles are anchored to the metallic substrate is 0.1 μm or longer and 0.6 μm or shorter,
    wherein the via hole has a first portion formed in the insulating layer and a second portion formed in the conductive layer, the second portion being stacked on the first portion along an axis direction of the via hole, and wherein the conductive paste is in contact with the insulating layer within the via hole.

11. The method for manufacturing a printed board according to claim 10, wherein the period during which the current is applied is one second to two seconds.

12. The method for manufacturing a printed board according to claim 10, wherein the conductive layer is covered by a plated metal layer.

13. The method for manufacturing a printed board according to claim 12, wherein the plated metal layer is contact with the conductive paste in the via hole.

14. The method for manufacturing a printed board according to claim 10, further comprising:
selectively removing the insulating layer and the metallic substrate, thereby forming a through hole passing through the insulating layer, the conductive layer, and the metallic substrate; and
filling the through hole with the conductive paste such that the surface of the metallic substrate in which the through hole opens is continuous with the surface of the conducive layer that is a wall surface of the through hole.

15. The method for manufacturing a printed board according to claim 10, wherein a diameter of the first portion is larger than a diameter of the second portion.

* * * * *